(12) United States Patent
Goodwin

(10) Patent No.: US 7,018,479 B2
(45) Date of Patent: *Mar. 28, 2006

(54) ROTATING SEMICONDUCTOR PROCESSING APPARATUS

(75) Inventor: Dennis L. Goodwin, Happy Jack, AZ (US)

(73) Assignee: ASM America, Inc., Phoenix, AZ (US)

( * ) Notice: Subject to any disclaimer, the term of this patent is extended or adjusted under 35 U.S.C. 154(b) by 126 days.

This patent is subject to a terminal disclaimer.

(21) Appl. No.: 10/428,197

(22) Filed: Apr. 29, 2003

(65) Prior Publication Data

US 2003/0200931 A1 Oct. 30, 2003

Related U.S. Application Data

(63) Continuation of application No. 09/550,680, filed on Apr. 17, 2000, now Pat. No. 6,554,905.

(51) Int. Cl.
*C23C 16/00* (2006.01)

(52) U.S. Cl. .................. 118/724; 118/728; 118/729; 118/730

(58) Field of Classification Search .......... 118/715, 118/730; 156/345.33, 345.34
See application file for complete search history.

(56) References Cited

U.S. PATENT DOCUMENTS

| | | | |
|---|---|---|---|
| 1,060,265 A | 4/1913 | Lamb | |
| 4,422,407 A | 12/1983 | Bessot et al. | |
| 4,446,817 A | 5/1984 | Crawley | |
| 4,558,660 A * | 12/1985 | Nishizawa et al. | 118/725 |
| 4,563,367 A | 1/1986 | Sherman | |
| 4,615,294 A | 10/1986 | Scapple et al. | |
| 4,798,165 A | 1/1989 | DeBoer et al. | |
| 4,836,138 A | 6/1989 | Robinson et al. | |
| 5,108,792 A | 4/1992 | Anderson et al. | |
| 5,254,172 A | 10/1993 | Otaki et al. | |
| 5,332,442 A * | 7/1994 | Kubodera et al. | 118/725 |
| 5,587,019 A | 12/1996 | Fujie | |
| 5,653,808 A * | 8/1997 | MacLeish et al. | 118/715 |
| 6,027,602 A | 2/2000 | Hung et al. | |
| 6,030,456 A * | 2/2000 | Tu | 118/708 |
| 6,121,579 A | 9/2000 | Aoki et al. | |
| 6,133,152 A | 10/2000 | Bierman et al. | |
| 6,210,484 B1 | 4/2001 | Hathaway | |
| 6,265,323 B1 | 7/2001 | Nakamura et al. | |
| 6,281,141 B1 | 8/2001 | Das et al. | |
| 6,288,367 B1 | 9/2001 | Robinson et al. | |
| 6,316,747 B1 | 11/2001 | Blersch et al. | |

(Continued)

FOREIGN PATENT DOCUMENTS

DE 44 37 361 4/1996

(Continued)

*Primary Examiner*—Parviz Hassanzadeh
*Assistant Examiner*—Karla Moore
(74) *Attorney, Agent, or Firm*—Knobbe Martens Olson & Bear LLP

(57) ABSTRACT

A reactor for processing semiconductor wafers and the like is provided. The reactor employs one or more rotating components to more evenly distribute temperature or gases within the chamber. In one embodiment, the reactor is provided with rotating reflectors, which reflect the heat generated from radiant heat lamps onto a stationary wafer in a reaction chamber. The rotation of the reflectors provides for a more uniform temperature distribution on the wafer. In another embodiment, the reaction chamber itself is rotated while the wafer is kept stationary. In another embodiment, a rotating showerhead is provided above the wafer through which gases flow to deposit onto the wafer in a uniform manner.

13 Claims, 7 Drawing Sheets

U.S. PATENT DOCUMENTS 6,319,556 B1  11/2001  Olsen et al.

FOREIGN PATENT DOCUMENTS

| JP | 5-335239 | 12/1993 |
| JP | 08-045863 | 2/1996 |
| JP | 09-036046 | 2/1997 |
| JP | 09036046 A  * | 2/1997 |
| JP | 10-97999 | 4/1998 |
| JP | 11-135449 | 5/1999 |
| WO | WO 99/45573 | 9/1999 |

* cited by examiner

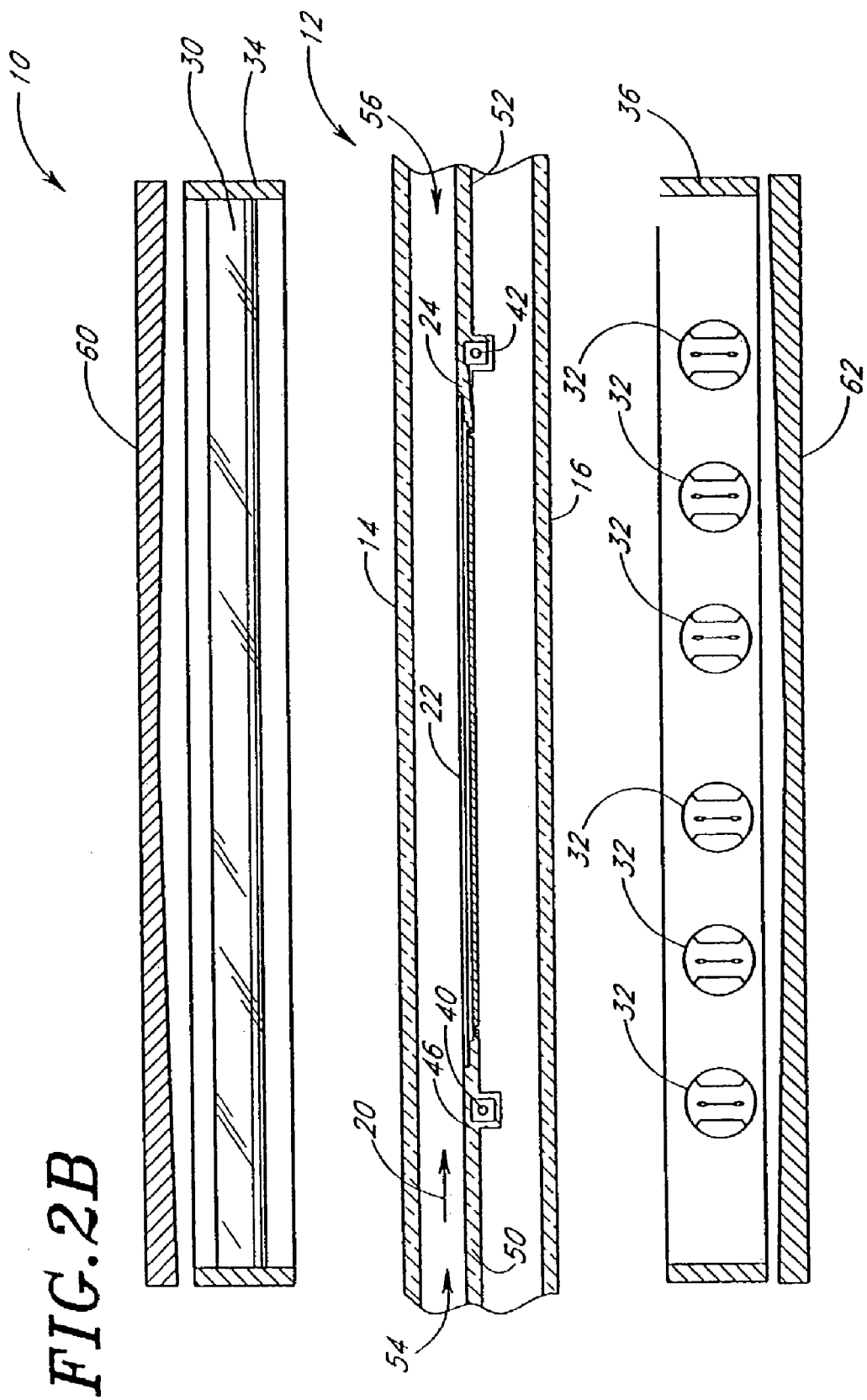

ROTATING SEMICONDUCTOR PROCESSING APPARATUS

CROSS REFERENCE TO RELATED APPLICATIONS

This is a continuation of U.S. patent application Ser. No. 09/550,680 filed on Apr. 17, 2000, now U.S. Pat. No. 6,554,905 which is incorporated herein by reference and made a part of the present disclosure.

BACKGROUND OF THE INVENTION

1. Field of the Invention

The present invention relates to an apparatus for processing of semiconductor wafers and the like, and more particularly, to a reactor having rotating components to produce a more uniform deposition.

2. Description of the Related Art

High-temperature ovens, called reactors, are used to create structures of very fine dimensions, such as integrated circuits on semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. If the deposited layer has the same crystallographic structure as the underlying silicon wafer, it is called an epitaxial layer. This is also sometimes called a monocrystalline layer because it has only one crystal structure. Through subsequent processes, these layers are made into integrated circuits, producing from tens to thousands or even millions of integrated devices, depending on the size of the wafer and the complexity of the circuits.

Various process parameters must be carefully controlled to ensure the high quality of the resulting layers. One such critical parameter is the temperature of the wafer during each treatment step of the processing. During CVD, for example, the deposition gases react at particular temperatures and deposit on the wafer. If the temperature varies across the surface of the wafer, uneven deposition of the reactant gas occurs and the thickness and resistivity will not be uniform. Non-uniformity of deposited layers also results from an uneven distribution of reactant gases over a wafer. Accordingly, it is important that wafer temperature and gas distribution be stable and uniform across the wafer.

Similarly, non-uniformity or instability of temperature across a wafer during other thermal treatments can affect the uniformity of resulting structures. Other processes for which temperature control can be critical include oxidation, nitridation, dopant diffusion, sputter depositions, photolithography, dry etching, plasma processes, and high temperature anneals.

One way that reactors have attempted to overcome the aforementioned problems is to provide a rotating wafer. An example of one such reactor is shown in U.S. Pat. No. 4,821,674. This reactor includes a circular rotatable susceptor having a diameter slightly larger than the wafer. The rotatable susceptor rotates the wafer about an axis normal to the center of the wafer. Rotation of the susceptor causes an averaging of the deposited material growth rates, alleviating the problem of concentration depletion of deposition materials as the reactant gas flows past the substrate. Rotation of the susceptor also produces an averaging of the temperature gradient, which results in a reduction in the temperature differences both in the susceptor and in the substrate being supported thereon.

Attempts to improve uniformity of deposition have also been made by providing a reactor with a showerhead gas inlet, as described in U.S. Pat. No. 4,798,165. In this reactor, gas is directed to a substrate through a plurality of apertures in a showerhead configuration to cause uniform gas flow over the surface of the substrate. Non-uniformity of deposition can further be reduced in this reactor by rotating the substrate as reactant gas showers down on the wafer.

Despite the advances in temperature and gas distribution uniformity in the reactors described above, a need still exists for a reactor or semiconductor processing apparatus that further improves uniformity of deposition. Accordingly, it is an object of this invention to provide a reactor or semiconductor processing apparatus that overcomes the limitations of the prior art to provide better temperature uniformity and gas distribution uniformity.

SUMMARY OF THE INVENTION

Briefly stated, the present invention addresses the needs described above by providing a reactor with rotating components to more evenly distribute temperature and processing gases within a reaction chamber. In accordance with one aspect of the present invention, a semiconductor processing apparatus is provided comprising a support structure for supporting a semiconductor wafer, and at least one component that is capable of rotation relative to the support structure to cause a more uniform distribution of temperature and gases over the wafer. The rotating component may be the reaction chamber itself, a reflector, a showerhead, or another component for uniformly distributing temperature and gases over the wafer.

In accordance with another aspect of the present invention, a semiconductor processing apparatus is provided. A processing chamber is provided, with a support structure for supporting a wafer located within the processing chamber. A plurality of heating elements is disposed around the chamber to heat the wafer within the chamber. At least one rotatable reflector is positioned to reflect heat generated by the heating elements toward the support structure.

In accordance with another aspect of the present invention, a reactor is provided comprising a chamber having substantially transparent walls and a heating assembly positioned adjacent the chamber. A reflector is positioned adjacent the heating assembly such that the heating assembly is located between the chamber and the reflector. The reflector is rotatable about a common axis shared by the chamber, heating assembly and reflector.

In accordance with another aspect of the present invention, a semiconductor processing apparatus is provided. The apparatus comprises a rotating processing chamber, a support structure for supporting a wafer within the processing chamber, and at least one heating element positioned outside of the chamber to heat the wafer within the processing chamber. The processing chamber is rotatable relative to the support structure.

In accordance with another aspect of the present invention, the processing apparatus comprises a reaction chamber having upper and lower walls. A wafer support structure is positioned inside the chamber to support a wafer. A rotatable showerhead is positioned above the wafer support structure having apertures through which reactant gases pass to deposit onto the wafer.

In accordance with another aspect of the present invention, a method for processing a semiconductor wafer is provided. A wafer to be processed is inserted into a reaction chamber. Heat is directed into the chamber toward the wafer. At least one processing gas is introduced into the chamber for deposition onto the wafer. A chamber component is rotated relative to the wafer while holding the wafer stationary, the rotation of the component creating a more uniform deposition on the wafer. The rotating chamber component may be, for example, one or more reflectors, a showerhead gas inlet, or a portion or all of the reaction chamber itself.

BRIEF DESCRIPTION OF THE DRAWINGS

FIG. 2B is a schematic sectional view of a reaction chamber wherein the susceptor is sealed to the slip ring and divider plate.

DETAILED DESCRIPTION OF THE PREFERRED EMBODIMENTS

The embodiments illustrated below describe a portion of an integrated circuit fabrication reactor, more particularly a semiconductor processing chamber having rotating components to improve temperature and gas distribution uniformity. While the preferred embodiments are described in the context of a "cold wall" CVD reactor for processing semiconductor wafers, it will be understood that the processing apparatus and methods described herein will have utility in the context of reactors of other types. In particular, one of skill in the art can find application for the apparatus and methods described herein for other semiconductor processing equipment, wherein a semiconductor substrate is to be treated at a controlled temperature. The present invention can also be implemented in conjunction with other heating/cooling systems, such as those employing inductive or resistive heating. Moreover, temperature and gas uniformity is often required in the treatment of other substrates, including, without limitation, the deposition, etching, doping, etc. of optical thin films on glass or other substrates. In addition, the reaction chamber described herein is merely exemplifying, and therefore, chambers of other types may be used in the reactor of the present invention.

Figure 1:
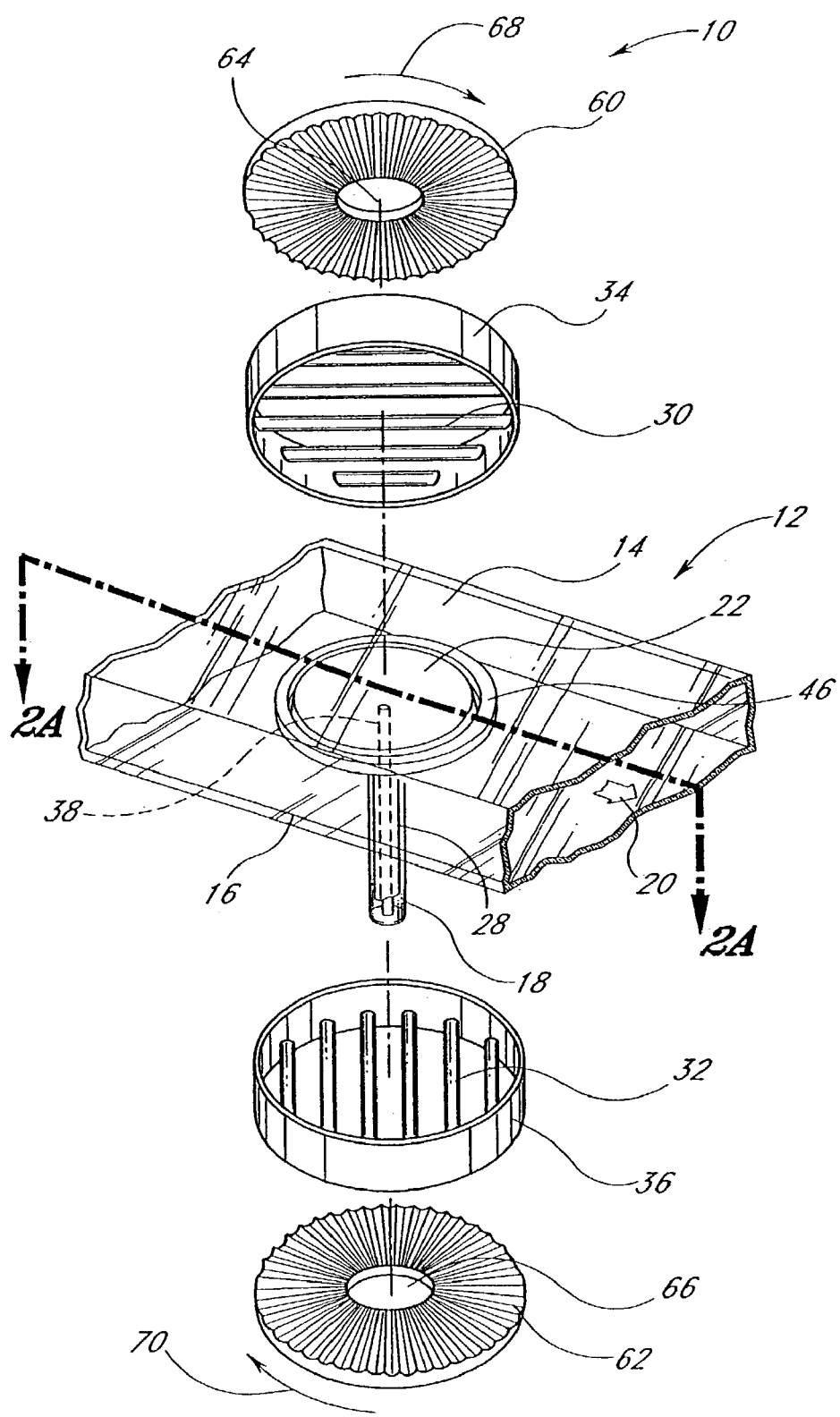
FIG. 1 is a schematic exploded perspective view of an exemplary reactor with rotating reflectors, constructed in accordance with a preferred embodiment of the present invention.
Figure 2A:
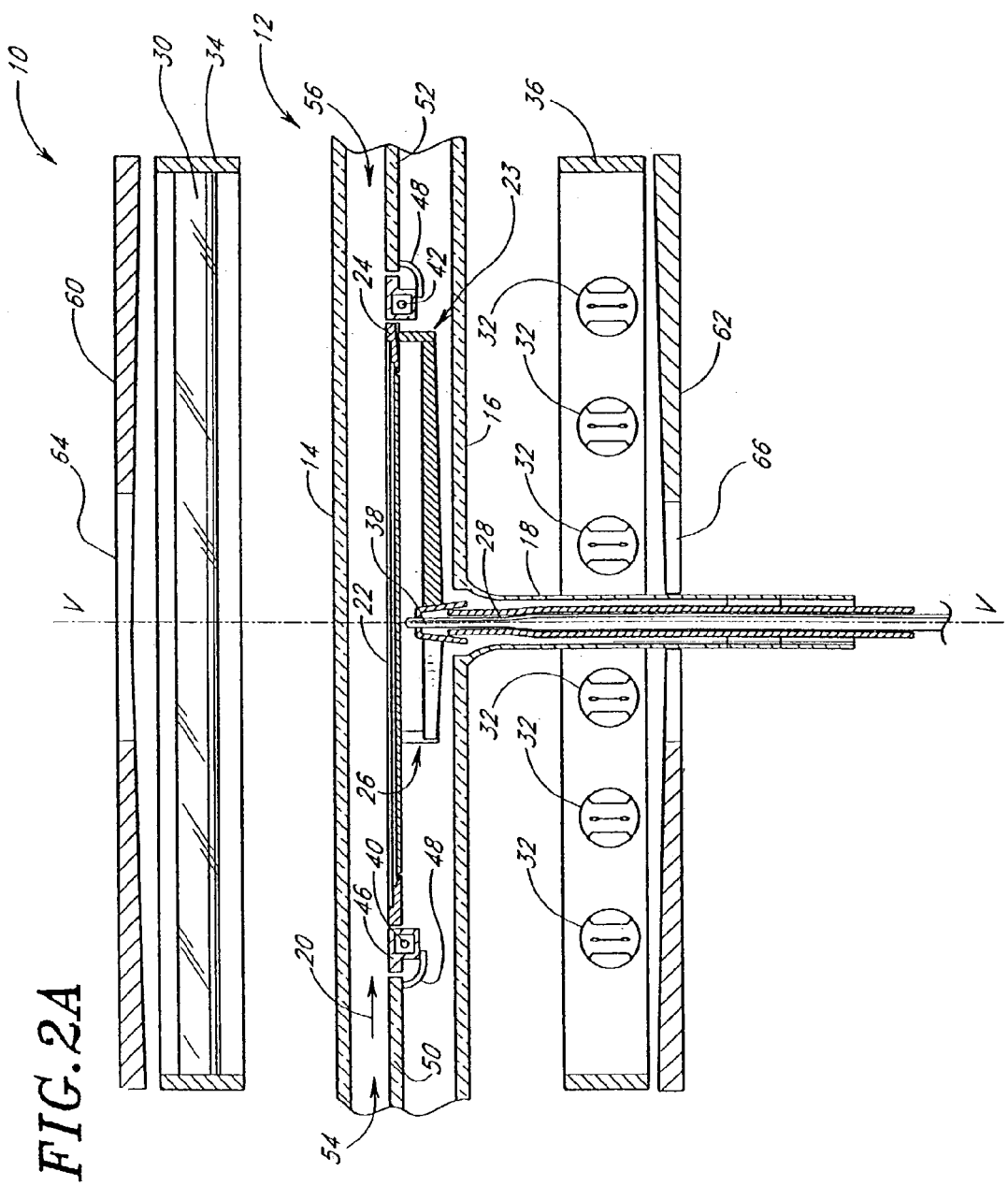
FIG. 2A is a schematic sectional view of the exemplary reaction chamber of FIG. 1, showing the internal chamber components.

FIGS. 1 and 2A illustrate one example of a chemical vapor deposition (CVD) reactor 10 or semiconductor processing apparatus. The apparatus includes a reaction chamber 12 of the horizontal flow type, formed of material transparent to radiant heat energy, such as fused quartz. The reaction chamber 12 includes a planar top wall 14 and a planar bottom wall 16 with a tubular shaft 18 depending therefrom. A reactant gas flows within reaction chamber 12 in a direction indicated by the arrow 20 to deposit materials on a wafer or substrate 22 placed in the reaction chamber at the beginning of the deposition cycle and removed therefrom after the cycle is completed.

The wafer 22 is supported on a wafer support structure 23 including a susceptor or wafer holder 24. The illustrated susceptor 24 is circular and is supported on a support spider 26 connected to a shaft 28 that extends downwardly from the reaction chamber 12 and coaxially through tubular shaft 18. The susceptor of the preferred embodiments is fixed, although it will be appreciated that a rotating susceptor may also be employed, rotatably driven by a drive shaft assembly. Advantageously, since the preferred susceptor is fixed and need not rotate, the susceptor 24 may be sealed with no gaps between it and surrounding structures that divide the chamber into vertical components. Such an embodiment is illustrated in FIG. 2B, as described below.

As shown in FIG. 2A, a plurality of radiant heat sources are supported outside the chamber 12 to provide heat energy to the chamber without appreciable absorption by the quartz chamber walls. The illustrated radiant heat sources comprise an upper heating assembly of elongated tube-type radiant heating elements 30. The upper heating elements 30 are preferably disposed in a horizontal spaced-apart parallel relationship and are also substantially parallel with the reactant gas flow path indicated by arrow 20 through the underlying reaction chamber 12. A lower heating assembly comprises similar elongated tube-type radiant heating elements 32 below the reaction chamber 12, preferably oriented transverse to the upper heating elements 30. The elongated tube-type radiant heating are contained in cylindrical housings 34 and 36, preferably comprising metal thermally insulated from surrounding structures. It will be appreciated, however, that housings of other shapes and configurations can be used as well.

Optionally, a plurality of spot lamps (not shown) may be provided below the lower heating assembly 32 to supply concentrated heat to the underside of the wafer support structure 23, as described in further detail below, to counteract a heat sink effect created by cold support structures extending through the bottom of the reaction chamber 12. It will be understood, however, that in this and alternate embodiments, the spider 26, shaft 28 and tubular shaft 18 are optional, and thus, the susceptor may be sealed to a divider plate and slip ring, such as described below and shown in FIG. 2B. Further details regarding these spot lamps, as well as other features of the chamber and reactor, are disclosed in assignee's copending application entitled METHOD OF PROCESSING WAFERS WITH LOW MASS SUPPORT, Ser. No. 09/184,491, filed Nov. 2, 1998, the entirety of which is hereby incorporated by reference.

Each of the elongated tube type heating elements 30, 32 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 30, 32 can be controlled independently or in grouped zones in response to temperature sensors.

In the illustrated reactor 12, the upper heating assembly includes six upper heating elements 30, which in one embodiment may have about 6 kW maximum power. The lower heating assembly includes six lower heating lamps 32 which may also have about 6 kW maximum power. It will be understood that other reactors may have greater or lesser power capacity. In particular, batch processors generally have a much greater capacity for heating the mass of a number of wafers simultaneously.

Figure 3:
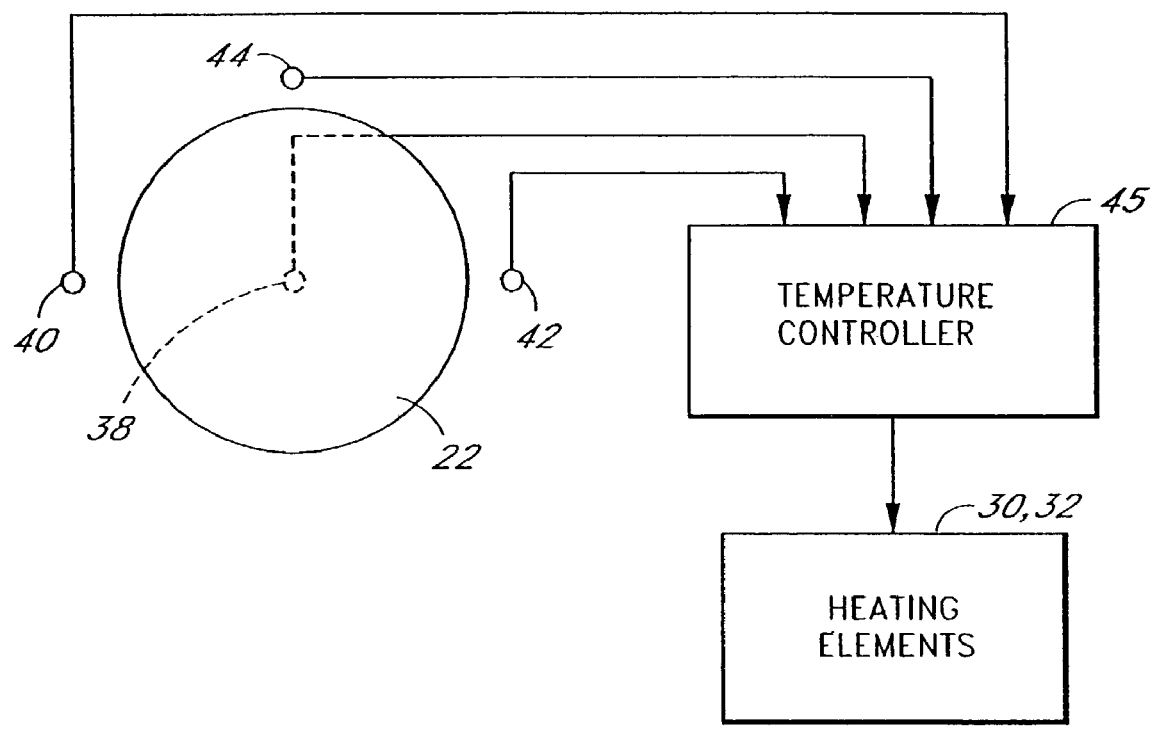
FIG. 3 is a schematic plan view of a wafer in relation to a plurality of temperature sensors and a temperature controller.

As shown in FIGS. 2A and 3, a plurality of temperature sensors are positioned in proximity to the wafer 22. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of a position in proximity to the wafer.

In the illustrated embodiment, the temperature sensors comprise thermocouples, including a first or central thermocouple 38, suspended below the wafer holder 24 in any suitable fashion. As is known, thermocouples directly supply a voltage, which serves as an indicator of temperature. The illustrated central thermocouple 38 passes through the spider 26 in proximity to the wafer holder 24. The reactor 10 further includes a plurality of secondary or peripheral thermocouples, also in proximity to the wafer 22, including a leading edge or front thermocouple 40, a trailing edge or rear thermocouple 42, and a side thermocouple 44 (FIG. 3). Each of the peripheral thermocouples is housed within a slip ring 46 which surrounds the wafer holder 24 and wafer 22.

As shown in FIG. 3, each of the central and peripheral thermocouples are connected to a temperature controller 45, which sets the power of the various heating elements 30, 32 in response to the readings of the thermocouples.

In addition to housing the peripheral thermocouples, the slip ring 46 absorbs radiant heat during high temperature processing, such that heat will flow toward the wafer 22 edges. This compensates for a tendency toward greater heat loss at wafer edges, a phenomenon which is known to occur due to a greater ratio of surface area to volume in regions near such edges. By minimizing edge losses and the attending radial temperature non-uniformities across the wafer 22, the slip ring 46 can reduce the risk of crystallographic slip. The slip ring 46 can be suspended by any suitable means. For example, the illustrated slip ring 46 in FIG. 2A rests upon elbows 48 which depend from a front chamber divider 50 and a rear chamber divider 52. The dividers 50, 52 desirably are formed of quartz.

The illustrated reaction chamber 12 includes an inlet port 54 for the injection of reactant and carrier gases. An outlet port 56 is on the opposite side of the chamber 12, with the wafer support structure 24 positioned between the inlet 56 and outlet 58. Further details regarding reaction chambers of this type are disclosed in assignee's copending application entitled METHOD OF PROCESSING WAFERS WITH LOW MASS SUPPORT, application Ser. No. 09/184,491, filed Nov. 2, 1998, and U.S. Pat. No. 4,975,561, both of which are hereby incorporated by reference in their entirety.

Desirably, a portion of the radiant heat is diffusely reflected into the chamber 12 by rough specular reflector plates above and below the upper and lower heating assemblies 30, 32, respectively. In some arrangements, the heating assemblies may include curved focusing reflectors to focus the radiant energy from some heating elements. For example, energy from peripheral heating elements in an upper heating chamber may be focused downward upon a temperature compensation ring, to compensate for peripheral heat losses at wafer edges, while central heating elements diffusely heat the wafer. U.S. Pat. No. 4,975,561, referenced above, discloses such radiant heat focusing elements. Other reflectors can be disposed outside all sides of the reaction chamber 12.

More preferably, as shown in FIGS. 1 and 2A, upper and lower reflectors 60 and 62 are preferably provided above and below the heating assemblies 30 and 32, respectively. Each of the reflectors is preferably a circular plate having an inner surface and an outer surface, with the inner surface of plate 60 facing downward toward the chamber 12 and the inner surface of plate 62 facing upward toward the chamber 12. These circular plates preferably have about the same diameter as the cylindrical housings 34 and 36. The inner surfaces of these plates are preferably concave inward toward the chamber 12, such that the thickness of the plates as measured between the inner and outer surfaces increases towards the outer edge of each plate. More preferably, as shown in FIG. 1, each of the plates includes a plurality of grooves bounded by ridges on its inner surface, each groove extending from the center of the plate to the outer edge and arranged circumferentially around the plate.

As shown in FIG. 2A, the plates 60 and 62 preferably have apertures 64, 66, respectively, which give the plates a substantially annular shape. Alternatively, the top plate 60 need not have aperture 64. Each of the grooves preferably forms a curved, concave channel that increases in width from the aperture 64, 66 to the outer edge of each of the plates. The surfaces of the grooves on the upper and lower reflector plates 60, 62 reflect radiant heat energy toward the susceptor 24, ring 46 and wafer 22. These surfaces are made of a specular material such as gold, and are polished, plated or the like to produce highly reflective surfaces.

Each of the reflector plates 60, 62 is preferably rotatable about a common central, vertical axis V, as shown in FIG. 2A. Rotation of the plates is preferably accomplished using a simple mechanical gear or belt pulley drive for a bearing mounted reflector array, as would be known to one of skill in the art. As shown by the arrows 68, 70 in FIG. 1, the upper plate 60 preferably rotates in a counterclockwise direction 68 and the lower plate 62 preferably rotates in a clockwise direction 70. In one embodiment, the upper plate 60 and the lower plate 62 rotate at a rate of between about 10 and 60 rpm. It will be appreciated that rotation may be slower or faster, and the skilled artisan will be able to optimize the desired rates of rotation. It will also be appreciated that differing rotation rates between the upper and lower plates, and different directions of rotation, may be used to provide greater control over the deposition.

The chamber described above may be used to process wafers of any size, and more preferably, wafers of 200 mm or 300 mm diameter. The reflectors 60 and 62 preferably have a diameter slightly larger than the diameter of the wafer, and in one embodiment, these reflectors are about 10 to 15 mm larger in diameter. The thickness of the plates 60 and 62 preferably increases from the apertures 64, 66, respectively, to a maximum at the outer edges of the plates. In one embodiment, each plate 60, 62 has between about 20 to 60 grooves, increasing in width from the apertures to the outer edges. It will be appreciated that various dimensions, shapes and sizes may be used for the rotating reflectors 60 and 62. It will also be appreciated that the one or more rotating reflectors may be positioned at other locations in and around a processing chamber to provide temperature uniformity to the wafer to be processed.

FIG. 2B illustrates one embodiment similar to that shown in FIG. 2A, wherein identical reference numerals refer to like components. In this embodiment, the wafer holder 24, slip ring 46, and divider 50, 52 are integrally formed, thereby eliminating the need for a separate wafer support structure. Thus, the wafer 22 remains fixed during processing. Furthermore, in this embodiment the reflector plates 60 and 62 need not be annular as described above.

Figure 4:
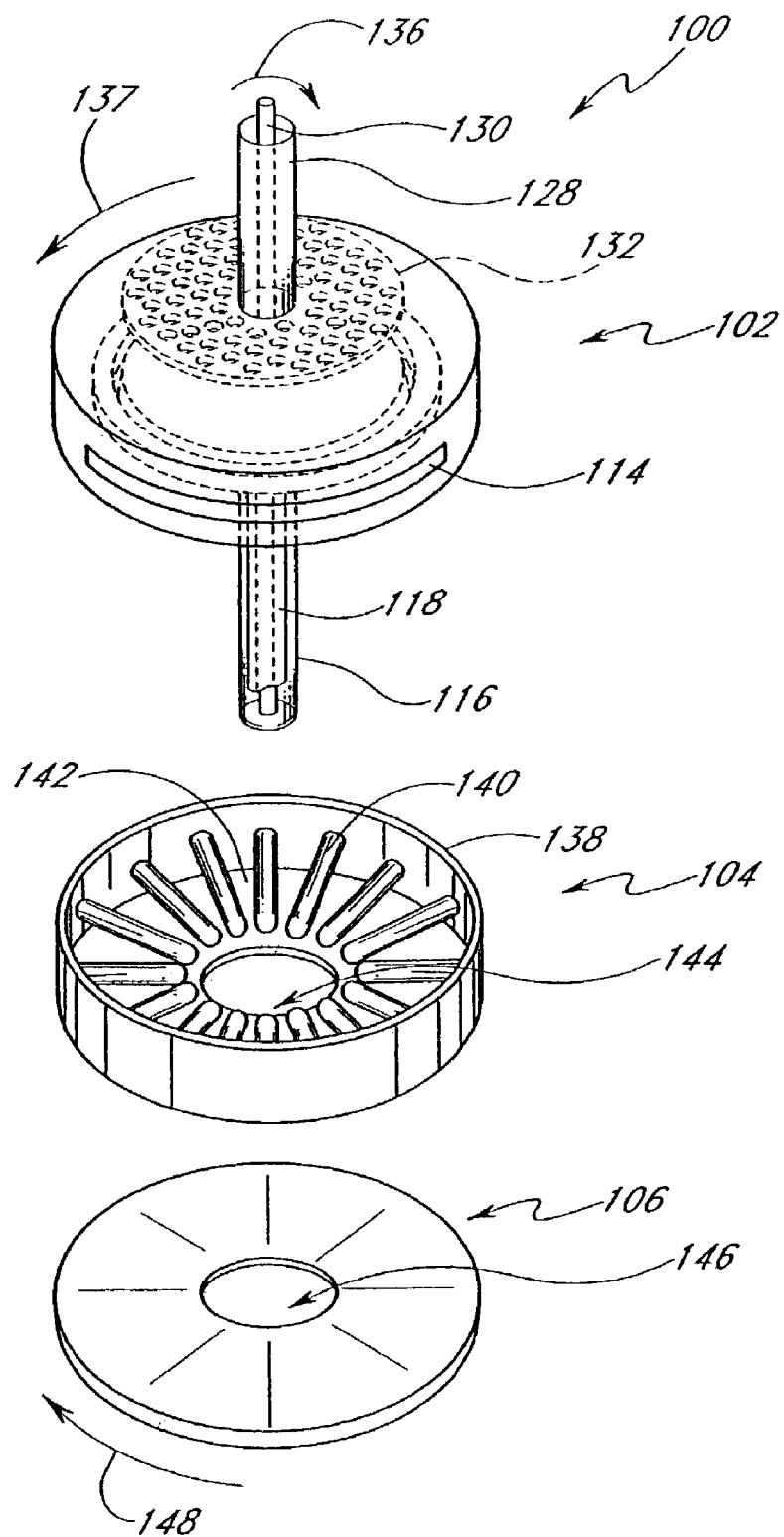
FIG. 4 is a schematic exploded perspective view of an exemplary reactor having a rotating reaction chamber, a rotating reflector and a rotating showerhead.
Figure 5:
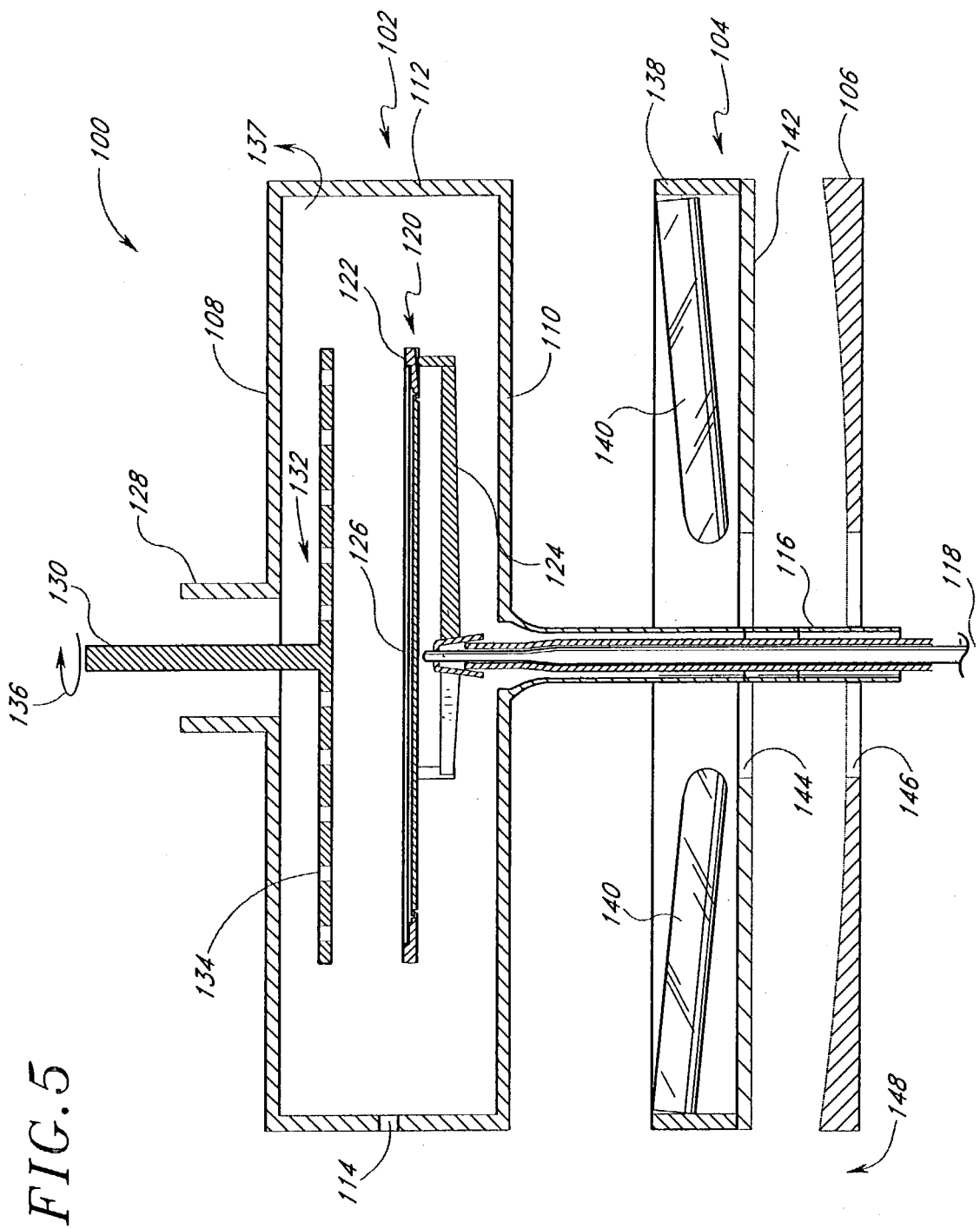
FIG. 5 is a schematic sectional view of the exemplary reactor of FIG. 4.

FIGS. 4 and 5 illustrate another preferred embodiment of a reactor 100 according to the present invention. The reactor 100 includes a reaction chamber 102, a heating assembly 104 and a reflector bank 106. The reaction chamber 102 as illustrated in FIGS. 4 and 5 is preferably a cylindrically shaped quartz chamber having an upper wall 108, a lower wall 110, a side wall 112, and an inlet 114 provided in the side wall 112 for wafer transfer. A tube 116 extends downward from the lower wall 110, through which a shaft 118 extends to support a wafer support structure 120. The illustrated support structure 120 includes a susceptor or wafer holder 122, upon which the wafer 126 rests, and a support spider 124 mounted to the shaft 118. The susceptor 122 is preferably stationary relative to the showerhead and reaction chamber, as described below. Temperature sensors may also be provided around the wafer holder, as described above.

The reaction chamber 102 also includes a tube 128 extending from the upper wall 108. Through this tube 128 extends a shaft 130 which supports a showerhead 132, shown more particularly in FIG. 6. The showerhead 132 is preferably a circular plate having a plurality of circular apertures 134 extending therethrough. As illustrated, this plate has substantially the same or slightly larger diameter than the wafer 126 to be processed, such that the apertures 134 lie over substantially the entire wafer. Providing the showerhead 132 with a larger diameter than the wafer ensures that any gas flow over the edges of the wafer do not affect the uniformity of deposition. Further details of showerhead designs that may be used with this chamber are described in U.S. Pat. No. 4,798,165, the entirety of which is incorporated by reference Gas flow into the chamber 102 preferably enters through the passageway defined between the tube 128 and the shaft 130. This passageway may also include a seal to prevent gas from exiting the chamber, as would be known to one of skill in the art. As gas enters the chamber, gas flow spreads out over the top surface of the showerhead 132 and through the apertures 134 such that the gas flow is distributed onto the wafer according to the pattern of apertures in the showerhead. In an alternative embodiment (not shown), the showerhead may further be provided with a plenum chamber connected therewith and extending from the passageway defined between tube 128 and shaft 130. In this embodiment, gas enters through the plenum chamber, which rotates with the showerhead, and is isolated from the chamber 102 until exiting through the apertures in the showerhead.

In one preferred embodiment, shown in FIG. 5, the showerhead 132 is rotational about its shaft 130, as indicated by arrow 136. Preferably, rotation of the showerhead is accomplished by a simple mechanical rotation mechanism, as would be known to one of ordinary skill in the art. Rotation can be provided in either a clockwise or counterclockwise direction. The rotation of the showerhead 132 while gas flows into the chamber causes the gases passing through the apertures 134 to distribute more uniformly over the wafer. In one embodiment, rotation of the showerhead occurs at a rate of between about 10 and 60 rpm.

Figure 6:
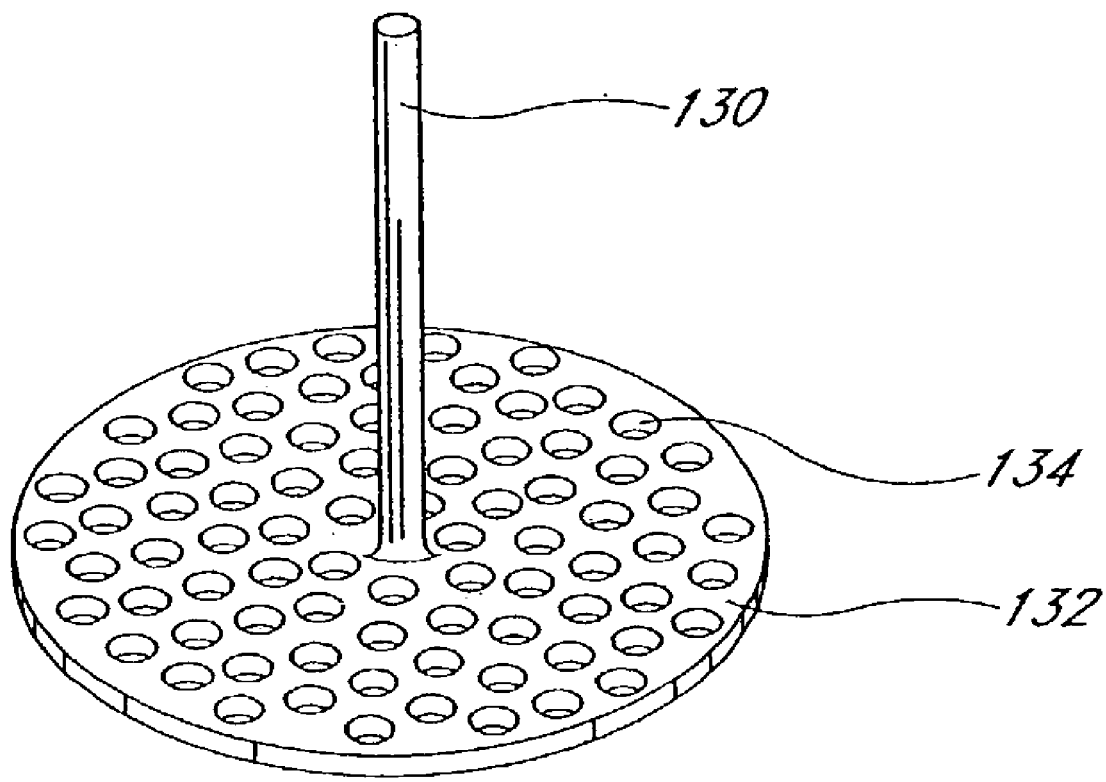
FIG. 6 is a perspective view of the rotating showerhead of FIG. 4.

It will be appreciated that the showerhead configuration shown in FIG. 6 may also be integrally formed with the chamber 102. In such arrangement, the gas inlet apertures 134 are provided directly in the upper wall of the chamber 102. Thus, because the chamber may be provided as rotating, as described below, the gas inlet apertures rotate with the chamber to provide a more uniform deposition over the wafer. Other embodiments incorporating a rotating showerhead configuration are also contemplated, as are other means for rotatably distributing processing gases over the wafer.

The embodiment illustrated in FIG. 4 also preferably includes a rotating chamber 102, as indicated by arrow 137. More particularly, either the upper or lower tube 128 or 116, or both, is attached to a rotation mechanism to rotate the chamber 102 along the common axis shared by these tubes. In the embodiment shown in FIG. 4, while the showerhead 132 rotates in a clockwise direction, the chamber 102 rotates counterclockwise. The chamber 102 may rotate at the same or different rate as that of the showerhead 132. It will be appreciated that the chamber can rotate in either direction (i.e., clockwise or counterclockwise), and with or against the direction of the showerhead 132. Rotating the chamber at the same time as the showerhead advantageously balances both the thermal profile and gas flow within the chamber.

The heating assembly 104 as shown in FIG. 4 preferably includes a cylindrical housing 138 containing a plurality of elongated tube-type radiant heating elements 140. One preferred type of heating element is a high intensity tungsten filament lamp having a transparent quartz envelope containing a halogen gas, such as iodine. Each of the heating elements 140 is supported on a base 142 having a circular opening 144. This opening 144 is adapted to allow the tube 116 to extend therethrough when the reactor 100 is assembled. Each heating element 140 is arranged to extend toward the cylindrical housing 138 away from the opening 144. More preferably, each heating element 140 is angled such that its end mounted to the housing 138 is elevated above the end mounted to the base 142. This arrangement focuses heat towards the wafer in the chamber.

The base 142 and housing 138 may be formed of a material such as gold-coated aluminum. In the illustrated embodiment, the heating assembly 104 contains 16 heating elements 140, although more or less heating elements may be used. The heating elements 140 may optionally be angled toward the housing 138 to focus the heat profile toward the wafer. It will be appreciated that various dimensions may be used for the heating assembly, and that additional heating assemblies may be provided above the chamber or at other locations in the reactor.

A reflector bank 106 is preferably provided below the heating assembly 104. As shown in FIG. 4, the reflector bank preferably has a circular, parabolic, concave upward shape toward the heating assembly 104 and includes a specular, highly polished coating. This shape focuses radiant energy toward the wafer support structure 120. The reflector bank 106 also has an opening 146 corresponding to the opening 144 of the heating assembly 104 to allow the tube 116 and shaft 118 extend therethrough.

The reflector bank 106 preferably rotates about a central vertical axis extending through the center of the circular opening 146, as indicated by arrow 148. In one embodiment, the reflector bank 106 preferably rotates at a rate of about 10 to 60 rpm. As shown in FIG. 4, the reflector bank 106 rotates in a clockwise direction when the chamber 102 rotates counterclockwise and the showerhead 132 rotates clockwise. It will be appreciated, however, that the reflector bank 106 can rotate counterclockwise as well and either with or against the direction of rotation of the chamber 102 and/or showerhead 132.

The reflector bank 106 illustrated in FIG. 4 preferably has a diameter which is substantially the same as that of the chamber, with the circular opening 146 having a diameter sufficient to accommodate the tube 116. The thickness of the bank 106 at its outer edge preferably decreases toward the opening 146. Although the preferred embodiment has been described as having only one reflector bank, additional rotating and nonrotating reflector banks may be provided surrounding the chamber to direct heat toward the wafer support structure.

The embodiments described above advantageously provide rotating reactor components to more uniformly distribute processing gases and temperature to a wafer to be processed. For example, by rotating reflectors, gas showerheads and/or the reaction chamber itself, a more uniform deposition may be achieved with a higher quality coating. Furthermore, these embodiments overcome the disadvantages of prior chambers which rotate the susceptor, because rotation of the susceptor requires a gap between the susceptor and surrounding parts which allows process gases to the backside of the susceptor or lower portion of the chamber. The presence of these gases on the backside of the susceptor therefore requires additional cleaning of the chamber. Moreover, the embodiments described above minimize the number of components inside the chamber by providing the rotation mechanism outside of the chamber. This simplifies chamber construction and eliminates additional surfaces in the chamber that may require additional cleaning, cooling or lead to contamination.

Another advantage of the above embodiments is that by providing more accurate control of temperature and gases in the chamber, these chambers require less power consumption and operate more efficiently than chambers of the prior art. In particular, the chambers described herein more effectively direct heat solely to the wafer rather than the other parts of the chamber, thereby minimizing heat loss.

It will be appreciated by those skilled in the art that various modifications may be made without departing from the scope of the invention, and all such modifications and changes are intended to fall within the scope of the invention, as defined by the appended claims.

What is claimed is:

1. A processing apparatus, comprising:
   a reaction chamber having upper and lower walls;
   a wafer support structure positioned inside the chamber to support a wafer;
   a first array of heating elements located outside of the reaction chamber;
   a rotatable reflector located outside the reaction chamber and positioned to reflect radiant heat toward the support structure; and
   a rotatable showerhead positioned above the wafer support structure, the showerhead having apertures through which reactant gases pass to deposit onto the wafer;
   wherein the reflector and showerhead are rotatable about a common axis independently of each other, the common axis passing through the reflector.

2. The apparatus of claim 1, further comprising a tube extending from the upper wall of the chamber.

3. The apparatus of claim 2, wherein the showerhead is supported on a rotating shaft extending through the tube.

4. The apparatus of claim 1, wherein the reaction chamber is rotatable relative to the wafer support structure.

5. The apparatus of claim 4, wherein the reaction chamber rotates in a direction opposite to the direction of rotation of the showerhead.

6. The apparatus of claim 1, wherein the showerhead is substantially circular.

7. The apparatus of claim 1, wherein the showerhead is positioned inside the chamber below the upper wall.

8. The apparatus of claim 1, wherein the showerhead has substantially the same diameter as that of the wafer.

9. The apparatus of claim 1, wherein the showerhead has a larger diameter than that of the wafer.

10. The apparatus of claim 1, wherein the showerhead is adapted to rotate at a rate of about 10 to 60 rpm.

11. The apparatus of claim 1, wherein the showerhead includes a perforated plate.

12. The apparatus of claim 1, further comprising a second reflector adapted to direct radiant heat from a second array of heating elements into the chamber.

13. A processing apparatus, comprising:
   a reaction chamber having upper and lower walls;
   a wafer support structure positioned inside the chamber to support a wafer;
   a first array of heating elements located outside of the reaction chamber;
   a reflector located outside the reaction chamber and positioned to reflect radiant heat toward the support structure; and
   a rotatable showerhead positioned above the wafer support structure, the showerhead having apertures through which reactant gases pass to deposit onto the wafer;
   wherein the reaction chamber is rotatable relative to the wafer support structure and rotates in a direction opposite to the direction of rotation of the showerhead.

* * * * *